United States Patent
Fayed

(10) Patent No.: US 7,675,345 B2
(45) Date of Patent: Mar. 9, 2010

(54) LOW-LEAKAGE LEVEL-SHIFTERS WITH SUPPLY DETECTION

(75) Inventor: Ayman A. Fayed, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/176,927

(22) Filed: Jul. 21, 2008

(65) Prior Publication Data

US 2009/0027102 A1  Jan. 29, 2009

Related U.S. Application Data

(60) Provisional application No. 60/951,521, filed on Jul. 24, 2007.

(51) Int. Cl.
  *H03L 5/00* (2006.01)
(52) U.S. Cl. .................. 327/333; 326/62; 326/80
(58) Field of Classification Search ............. 326/62–63, 326/80–81; 327/306, 333
See application file for complete search history.

(56) References Cited

U.S. PATENT DOCUMENTS

| 7,230,475 B2 * | 6/2007 | Choi et al. | 327/544 |
| 7,375,574 B2 * | 5/2008 | Kanno et al. | 327/333 |
| 7,471,106 B2 * | 12/2008 | Jahan et al. | 326/68 |

* cited by examiner

*Primary Examiner*—Dinh Le
(74) *Attorney, Agent, or Firm*—Lawrence J. Bassuk; W. James Brady; Frederick J. Telecky, Jr.

(57) ABSTRACT

Low-leakage level-shifters with reduced leakage are disclosed. In one example, a level-shifter circuit to reduce leakage when there is an invalid supply voltage is described, including a level-shifter configured to shift a voltage of an digital input signal based on a first supply voltage to a digital output signal based on a second supply voltage, comprising a first transistor and a second transistor configured to set the digital output signal based on the digital input signal, a supply detector configured to generate a detection signal based on the first supply voltage, a disabler configured to, based on the detection signal, set the digital output signal of the level-shifter to a predetermined state, and a leakage reducer configured to, based on the detection signal, electrically disconnect the first and second transistors from the level-shifter.

17 Claims, 5 Drawing Sheets

LOW-LEAKAGE LEVEL-SHIFTERS WITH SUPPLY DETECTION

RELATED APPLICATIONS

This application claims the benefit of U.S. Provisional Application No. 60/951,521, filed Jul. 24, 2007, the entirety of which is incorporated by reference.

FIELD OF THE DISCLOSURE

This disclosure relates generally to level-shifter circuits and, more particularly, to low-leakage level-shifters with supply detection.

BACKGROUND

In circuit systems having different circuits powered by different power supplies, digital signals passing between power supply domains are often level-shifted to change the voltage of the signals to be consistent with the domains. A digital input signal exists in an input domain, in which circuits are powered by a first power supply. A digital output signal exists in an output domain, in which circuits are powered by a second power supply. Level-shifting the digital signals ensures the correct logical values are passed from circuits in the input power supply domain to circuits in the output power supply domain.

In conventional level-shifter circuits, when the power supply voltage of an input domain is insufficient (e.g., in a situation in which the input domain power supply is powered down), the input to the conventional level-shifter may be a floating voltage value. A floating level-shifter input can cause high current leakage from a power supply powering the output domain. For example, if a first circuit powered by a first power supply is configured to pass a digital signal to another circuit powered by a second power supply, the second power supply may suffer high leakage via the level-shifter if the first power supply does not have a sufficient voltage for the first circuit to produce a valid input signal to the second circuit.

SUMMARY

Figure 1:
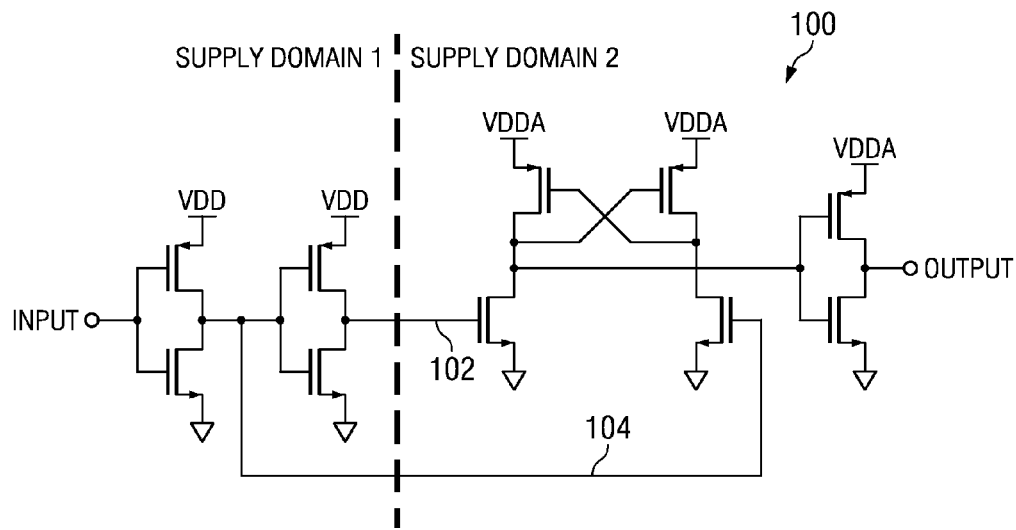
FIG. 1 is a schematic diagram of a traditional level-shifter circuit.

Low-leakage level-shifters with supply detection are described. In one example implementation, a level-shifter circuit is described that reduces leakage when there is an invalid power supply voltage. In one example, the level-shifter circuit operates in an environment including a first supply voltage in a first power supply domain and a second supply voltage in a second power supply domain. A level-shifter is configured to shift a voltage of a digital input signal based on the first supply voltage to a digital output signal based on the second supply voltage. In one example, the level-shifter includes a first transistor and a second transistor configured to set the digital output signal based on the digital input signal. The example level-shifter circuit also includes a supply detector configured to generate a detection signal based on the first supply voltage and a disabler configured to, based on the detection signal, set the digital output signal of the level-shifter to a predetermined state. Lastly, the example level-shifter circuit includes a leakage reducer configured to, based on the detection signal, electrically disconnect the first and second transistors from the level-shifter.

DETAILED DESCRIPTION

Certain examples are shown in the above-identified figures and described in detail below. In describing these examples, like or identical reference numbers may be used to identify common or similar elements. The figures are not necessarily to scale and may show varying levels of detail regarding certain features for clarity and/or conciseness. Although the following discloses example methods and apparatus, it should be noted that such methods and apparatus are merely illustrative and should not be considered as limiting. The example circuits described herein may be implemented using discrete components, integrated circuits (ICs), or any combination thereof.

Additionally, it is contemplated that any form of logic may be used to implement portions of methods or apparatus herein. Logic may include, for example, circuit implementations that are made exclusively in dedicated hardware (e.g., circuits, transistors, logic gates, hard-coded processors, programmable array logic (PAL), application-specific integrated circuits (ASICs), etc.), exclusively in software, exclusively in firmware, or some combination of hardware, firmware, and/or software. Accordingly, while the following describes example methods and apparatus, persons of ordinary skill in the art will readily appreciate that the examples are not the only way to implement such methods or apparatus.

The example methods and apparatus described below may be used to provide low-leakage level-shifter circuits with supply detection. In an example implementation, digital signals are shifted from a first supply domain having a first power supply to a second supply domain having a second power supply. In some situations in which the first power supply produces an insufficient or invalid voltage, the level-shifter circuit prevents significant current leakage in the second supply domain that occurs in previous level-shifter circuits. The example level-shifter circuits also provide a known output when the first power supply voltage is invalid.

In the following examples, a supply voltage (e.g., VDD, VDDA, VDDALDO) may be considered valid when the supply voltage is greater than a voltage threshold indicative of an active circuit. For example, the valid voltage threshold for a digital circuit may be the voltage at which logic in the digital circuit is guaranteed to produce predictable values (i.e., to reliably produce voltage levels indicative of logical zero and logical one states). In contrast, a supply voltage may be considered invalid when below the voltage threshold.

In one described example, a level-shifter circuit includes a supply detector that generates a detection signal based on the state of the first voltage supply. An example supply detector is described that may be used for circuits having a first power supply at a higher voltage than the second power supply. Another example supply detector is also described that may be used for circuits having a first power supply at a lower voltage than the second power supply.

The example level-shifter circuits allow a user to disconnect power from circuitry in the first supply domain and avoiding current leakage in the second supply domain that occurs when using previous level-shifters. The example circuits further provide a predictable output from the level-shifter in the second supply domain when the first supply voltage is invalid.

FIG. 1 is a schematic diagram of a traditional level-shifter circuit 100. A digital input signal begins in supply domain 1 at an input terminal, with a voltage supply of VDD. The level-shifter circuit 100 shifts the voltage level of the input signal to an appropriate range in supply domain 2, which has a voltage supply of VDDA to represent the digital signal. The level-shifter circuit 100 then outputs a digital signal that has a digital (i.e., logical) value that is equal to the digital value of the input signal, but has a different voltage at an output terminal. For example, in a system in which VDD is 1.8V, VDDA is 3.3V, and both supply domains have a ground reference of 0V, a logic high (i.e., 1) input signal is a 1.8V signal at the input terminal, and a logic high signal is then output at the output terminal at 3.3V.

However, in certain situations VDD is not a full 1.8V. For example, during power supply sequencing while starting the circuit, VDDA may be powered on before VDD is powered on. In another situation, VDD and VDDA are both powered on simultaneously, but VDDA ramps up to full voltage more quickly than VDD. In yet another situation, a user or designer decides to disconnect VDD from unnecessary circuitry (not shown) to save power. In these situations, substantial leakage may occur in the level-shifter 100 due to an invalid supply voltage in supply domain 1. Specifically, in these situations, nodes 102 and 104 are floating with respect to the ground reference, which prevents the level-shifter 100 from switching to digital values and permitting substantial current to flow through the level-shifter 100. Substantial leakage current adversely affects battery life in mobile devices that utilize the level-shifter 100. Further, the output signal from the level-shifter 100 is unpredictable when VDD is at an invalid voltage, because floating inputs at 102 and 104 may result in a high or low output from the level-shifter 100.

Figure 2:
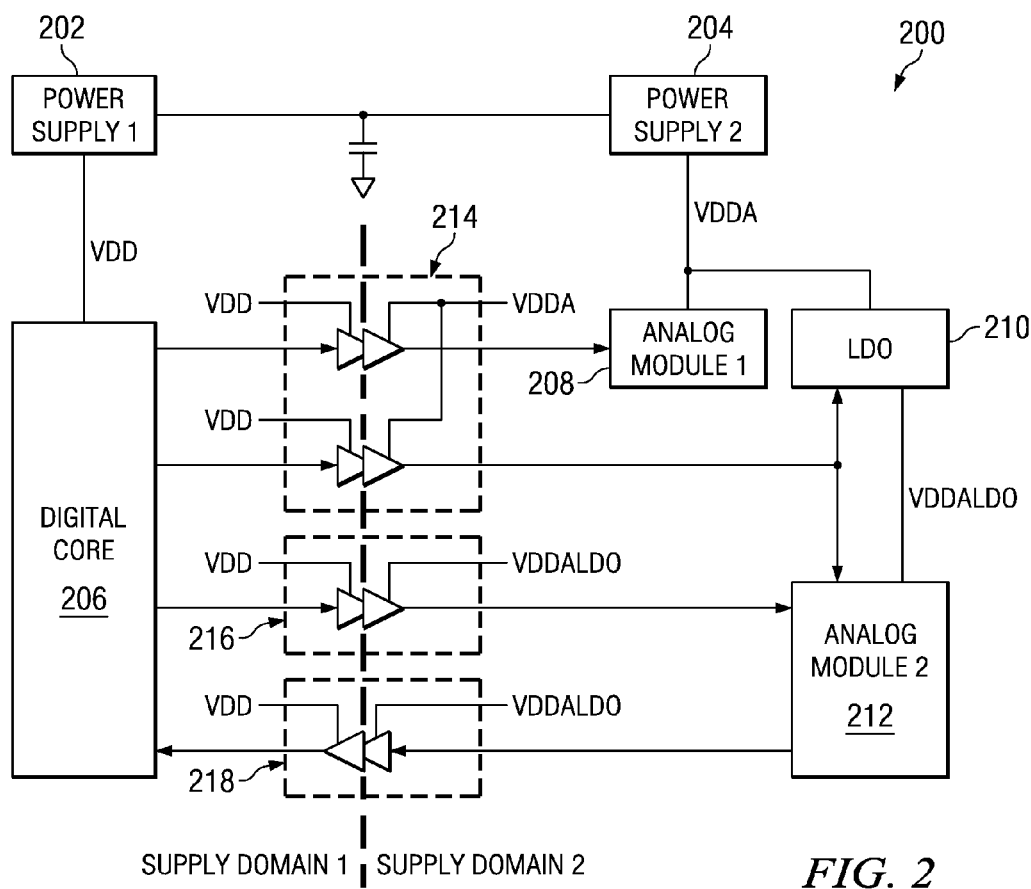
FIG. 2 is a block diagram of an example power supply architecture powering two different circuits at two different supply voltages in two different domains.

FIG. 2 is a block diagram of an example power supply architecture 200 powering two different circuit systems at two different supply voltages in two different domains. The example power supply architecture 200 includes two power supplies 202 and 204. The first power supply 202 generates a first voltage (VDD) that provides power to a digital core 206. An example digital core 206 may be a microprocessor or other digital logic. The first power supply 202 and the digital core 206 reside in supply domain 1, in which the voltage may range from a ground reference (e.g., 0V) to VDD. The second power supply 204 generates a second voltage (VDDA) that is different than the first voltage VDD. The second voltage VDDA provides power to a first analog module 208 (e.g., a digital-to-analog converter) and a low drop-out regulator (LDO) 210. The LDO 210 generates another voltage VDDALDO that is substantially the same voltage as VDDA to provide power to a second analog module 212. Because VDDA and VDDALDO have approximately the same voltage levels (at least, relative to VDD), VDDA and VDDALDO are both considered to be part of the same supply domain. The second power supply 204, LDO 210, and analog modules 208 and 212 reside in supply domain 2, where the voltage may range from 0V to VDDA.

For clarity, the example power supply architecture 200 will be discussed using a case in which the second power supply 204 generates a higher supply voltage VDDA (e.g., 1.8V) than VDD (e.g., 1.1V) generated by the first power supply 202. However, it should be readily recognized that the methods and apparatus discussed herein may be modified to apply to other power supply situations.

The digital core 206 and the analog modules 208 and 212 shift digital signals between supply domain 1 and supply domain 2. Digital signals may include data signals to or from the digital core 206 to analog modules 208 and/or 212, and control signals may include signals from the digital core 206 to the analog modules 208 and/or 212. However, due to the different voltages generated by the power supplies 202 and 204, digital signals in supply domain 1 may not provide the proper voltage for digital signals in supply domain 2. Therefore, the power supply architecture 200 is provided with level-shifters 214, 216, and 218. The level-shifters 214, 216, and 218 change a voltage level for a digital signal from one voltage (e.g., VDD/0V) to a second voltage (e.g., VDDA/0V).

The level-shifters 214, 216, and 218 may be separated into groups by input and output voltage supply. The level-shifters 214 shift digital signals from VDD to VDDA, the level-shifters 216 shift digital signals from VDD to VDDALDO, and the level-shifters 218 shift digital signals from VDDALDO to VDD. Digital signals passing through the level-shifters 214 typically include control and power up/down signals to control the analog modules 208 and 212. Digital signals passing through the level-shifters 216 and 218 are typically for digital data communications between the analog module 212 and the digital core 206, which are dynamic signals and therefore tend to leak more current.

Figure 3:
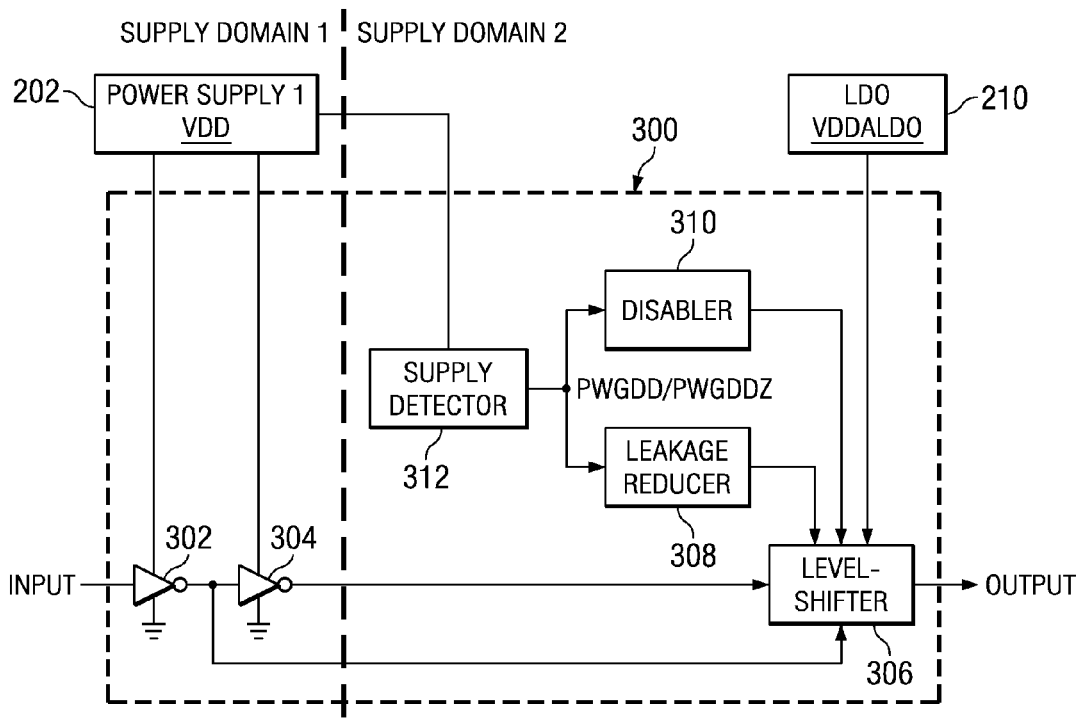
FIG. 3 is an example implementation of one of the level-shifter circuits of FIG. 2 including leakage protection, to shift signals from a first supply domain to a second supply domain.

FIG. 3 is an example implementation of one of the level-shifter circuits of FIG. 2, to shift signals from a first supply domain to a second supply domain, including leakage protection. Specifically, FIG. 3 is a block diagram of a level-shifter 300 that may be used to implement the level-shifter 216 of FIG. 2. The level-shifter 300 is powered by the power supply 202 in supply domain 1 and the LDO 210 in supply domain 2, and shifts an input signal (Input) from supply domain 1 (VDD) to supply domain 2 (VDDALDO) to generate an output signal (Output). The power supply 202 provides power to NOT gates 302 and 304, which provide digital signals equal to InputZ and Input, respectively, to a level-shifter 306. The level-shifter 306 is powered by the LDO 210, and generates the output to have a digital value equal to the input, although at a different voltage level.

As described above, a traditional level-shifter may suffer from significant leakage current and the output signal may be unpredictable in the event that the power supply 202 is not providing a valid VDD to supply domain 1. Therefore, the example level-shifter circuit 300 is provided with a leakage reducer 308 and a disabler 310. The leakage reducer 308 prevents significant leakage from occurring in the level-shifter 306 when the power supply 202 is not providing a valid voltage at VDD. The disabler 310 prevents the output from having an unpredictable value when VDD is at an invalid voltage. For the leakage reducer 308 and the disabler 310 to respond to a situation in which VDD is invalid, the level-shifter circuit 300 is further provided with a supply detector 312. The supply detector 312 detects the state VDD (i.e., the power supply 202) and generates a signal to indicate to the leakage reducer 308 and the disabler 310 whether VDD is valid.

During normal operation, the supply detector 312 detects VDD from the power supply 202 and generates a PWGDD signal and a PWGDDZ signal to indicate VDD is valid. As a result, the leakage reducer 308 and the disabler 310 do not affect the operation of the level-shifter 306. However, if the supply detector 312 detects that VDD is invalid, the leakage reducer 308 acts to reduce leakage current in the level-shifter 306 and the disabler 310 causes the level-shifter 306 to generate a predictable output.

In some situations, the supply detector 312 is unable to determine whether VDD is valid. For example, the supply detector 312 may determine that VDD is valid if VDD is greater than 0.7V and determine that VDD is invalid if VDD is less than 0.3V. While VDD is less than 0.7V and greater than 0.3V, the supply detector 312 may be unable to consistently determine whether VDD is valid. To handle this event, the disabler 310 is configured to cause the level-shifter 306 to output a predictable value until the supply detector 312 determines that VDD is valid.

Figure 4:
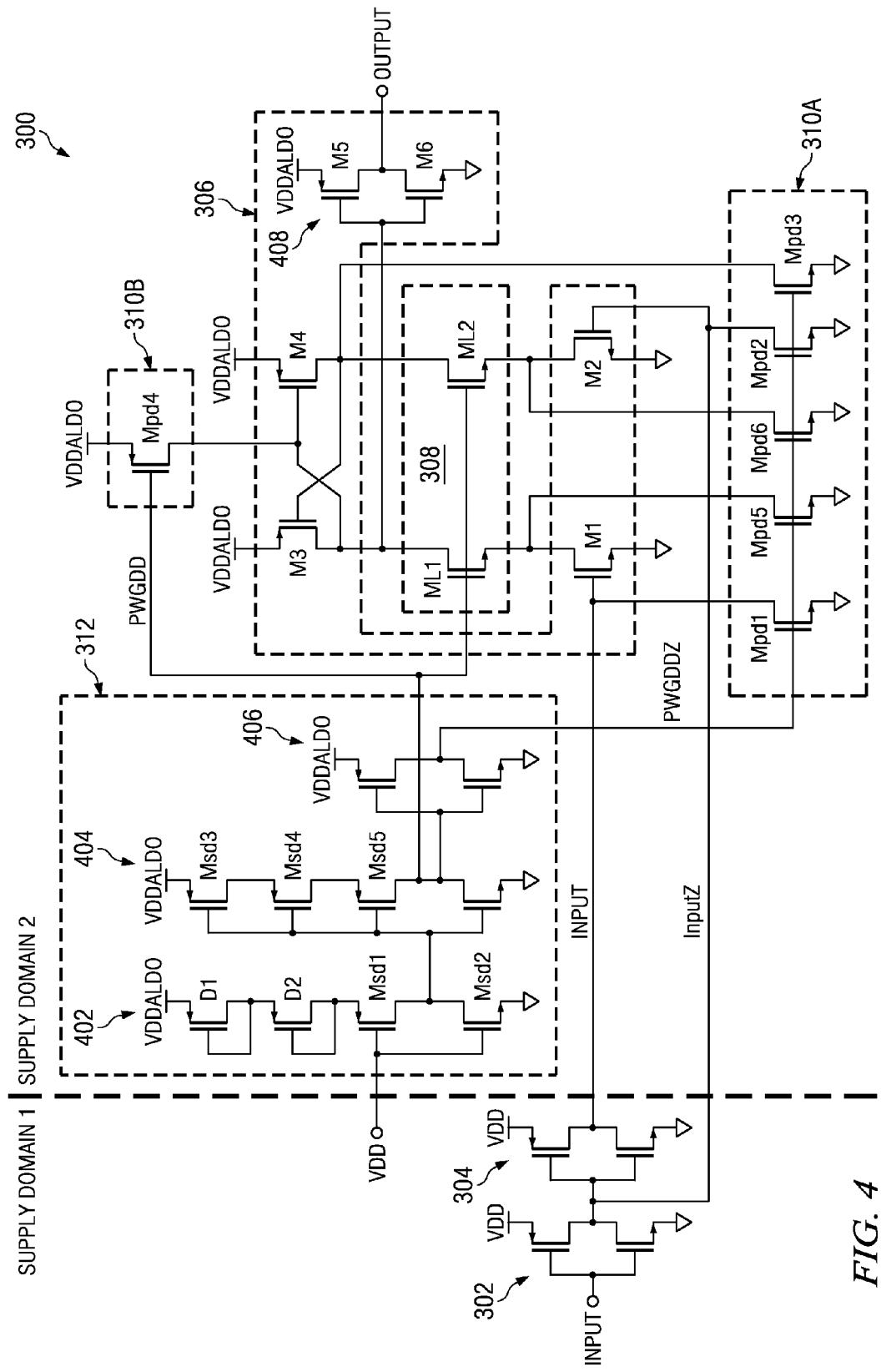
FIG. 4 is a more detailed schematic diagram of a level-shifter circuit to implement the example level-shifter circuit of FIG. 3.

FIG. 4 is a more detailed schematic diagram of a level-shifter circuit to implement the example level-shifter circuit 300 of FIG. 3. As mentioned above, the example level-shifter circuit 300 includes NOT gates 302 and 304, a level-shifter 306, a leakage reducer 308, a disabler 310A-B, and a supply detector 312.

The following example will describe the operation of the level-shifter circuit 300 under normal operating conditions (i.e., VDD is valid). In this example, the input signal will be a logical high (i.e., logic 1). The input signal is used by the first NOT gate 302 to generate a logical inverse signal InputZ (i.e., logic low, 0). The second NOT gate 304 is then used to generate Input as a logical inverse signal of InputZ, which is equal to the digital input signal. The Input and InputZ signals are at the voltage levels of supply domain 1 (i.e., VDD to 0V).

The example level-shifter 306 includes a first n-channel transistor M1 controlled by the Input signal at a gate terminal, and a second n-channel transistor M2 controlled by the InputZ signal at a gate terminal. A first p-channel transistor M3 includes a drain terminal that is coupled to the drain terminal of M1 via the leakage reducer 308 as described below. Similarly, a second p-channel transistor M4 includes a drain terminal that is coupled to the drain of the transitor M2 via the leakage reducer 308. M3 and M4 include gate terminals that are cross-coupled, such that the gate of M3 is coupled to the drain of M4 and the gate of M4 is coupled to the drain of M3.

Assuming for a moment that the leakage reducer 308 presents substantially a short-circuit between the transistors of the level-shifter 306 (as in the normal operating conditions of this example), and ignoring the disabler 310A-B, the transistors M1 and M2 selectively couple the gates of M4 and M3 to ground based on the states of Input and InputZ, respectively. The transistors M3 and M4 each selectively cross-couple the gate of the other to VDDALDO based on M1 and M2 and, therefore, based on Input and InputZ, respectively. The gate of M4 (i.e., the drain of M3) is further output to a logical NOT gate 408, which includes transistors M5 and M6. The output of the logical NOT gate 408 is the output of the level-shifter 306 and, thus, is the output of the level-shifter circuit 300.

Returning to the example in which Input is logic high, M1 couples the gate of M4 to ground and M2 decouples the gate of M3 from ground due to InputZ. M4 then couples the gate of M3 to VDDALDO, which decouples the drain of M3 from VDDALDO. As a result, the input to the logical NOT gate 408 is 0V, or logic low, and the output is logic high at VDDALDO. Therefore, the output value is equal to the input value with a shifted voltage level.

Due to the high data speeds that may appear at the input, the transistors M1-M4 are implemented with substantially wide channels to accommodate high switching speeds. Since this may cause high current leakage, the leakage reducer 308 and the disabler 310 are included to reduce current leakage. A portion of the example disabler 310A includes transistors Mpd1, Mpd2, Mpd3, Mpd5, and Mpd6, which selectively pull down the gates of the transistors M1, M2, and M3 and the drain terminals of M1 and M2 to 0V in response to the supply detection signal PWGDDZ. Another portion of the disabler 310B includes a transistor Mpd4 pulls up the gate of M4 to VDDALDO in response to the supply detection signal PWGDD. The selective pull down and pull up actions serve to disable transistors (e.g., M3), effectively remove (i.e., disconnect) transistors from the level-shifter 306 (e.g., M1 and M2), and/or set the level-shifter 306 to a particular state (e.g., M4).

It may be observed that when VDD is invalid, at least one of M1 or M2 has a source-drain voltage of VDDALDO, which can cause substantial leakage in a wide-channel transistor. Therefore, the example level-shifter circuit 300 is provided with a leakage reducer 308 that includes a first n-channel transistor ML1 that selectively couples the drain terminals of M1 and M3 in response to the PWGDD signal at a gate terminal. The leakage reducer 308 further includes a second n-channel transistor ML2 that selectively couples the drain terminals of M2 and M4 in response to the PWGDD signal. The transistors ML1 and ML2 are configured to present substantially a short-circuit when VDD is valid. However, when VDD is invalid, ML1 and ML2 decouple M1 from M3 and M2 from M4, respectively. In combination with the disabler 310A-B, at least one of ML1 or ML2 then has a drain-source voltage of VDDALDO. However, ML1 and ML2 may be configured to have smaller channels than the transistors M1-M4, resulting in significantly less leakage current than would occur without the leakage reducer 308.

As mentioned above, the leakage reducer 308 and the disabler 310 are enabled based on the detection signals PWGDD and PWGDDZ. The supply detector 312 generates the supply detection signals PWGDD and PWGDDZ, which is the logical inverse of PWGDD, based on VDD. The supply detector includes three inverter stages 402, 404, and 406, which are powered by VDDALDO. Because the maximum VDD is significantly less than VDDALDO, the first inverter stage 402 includes transistors Msd1 and Msd2 configured as a logical NOT gate, as well as diode-connected transistors D1 and D2. The transistors D1 and D2 may be configured to provide the source terminal of the transistor Msd1 with a voltage substantially equal to the maximum value of VDD (i.e., 1.1V). Thus, when VDD is valid (i.e., VDD>0.7V), the input to the inverter stage 404 is substantially at 0V. In contrast, when VDD is invalid (i.e., VDD<0.3V), the input to the inverter stage is substantially at VDDALDO.

The output of the inverter stage 402, which, in this example, is 0V, is then input to the next inverter stage 404. The example inverter stage 404 is configured as a logical NOT gate having an extended-length p-channel transistor, including transistors Msd3, Msd4, and Msd5. The length of the p-channel transistor may be modified depending on the application. The output of the inverter stage 404 is logic high, substantially at VDDALDO, and is used as the PWGDD signal to indicate that VDD is valid. A third inverter stage 406 generates PWGDDZ as the logical inverse of PWGDD, which, in this example, is logic low. Next, the Input, InputZ, PWGDD, and PWGDDZ signals are input to the level-shifter 306, the leakage reducer 308, and the disabler 310 to generate the output signal as described herein.

In another example case, VDD is invalid (e.g., VDD<0.3V) and, as a result, the input is at logic low due to a lack of power in supply domain 1. As such, it is desirable to limit current leakage at the level-shifter circuit 300 and generate an output signal that is logically equal to the input signal. To this end, the leakage reducer 308 and the disabler 310 are responsive to the PWGDD and PWGDDZ signals. At the supply detector 312, the first inverter stage 402 outputs a logic high (VDDALDO) signal to the second inverter stage 404. The second inverter stage 404 then generates PWGDD to be a logic low signal. The third inverter stage 406 generates PWGDDZ as a logic high signal.

The disabler 310A-B, in response to the PWGDDZ signal, pulls down all terminals of M1 and M2, as well as the gate terminal of M3. The disabler 310B also pulls up the gate of the transistor M4 to VDDALDO. This causes the output from the gate of M4 to the logical NOT gate 408 to be pulled high, and the output from the level-shifter 306 is logic low and is logically equal to the input. Additionally, the leakage reducer 308 responds to the logic low PWGDD signal by switching off, or preventing substantial current conduction. As a result, the drain of ML1 is substantially at VDDALDO and the source of ML1 is substantially at 0V. The drain and source of ML2 are both at 0V. Due to the smaller channel of ML1, however, very little leakage current flows from VDDALDO to ground.

The supply detector 312 provides a high VDD threshold, above which the detection signals are guaranteed to indicate that VDD is valid, and a low VDD threshold, below which the detection signals are guaranteed to indicate that VDD is invalid. When VDD is between the high and low thresholds, the detection signals cannot be guaranteed due to unstable or varying logic thresholds of the inverter stages 402-406. VDD may enter such a range while ramping up during startup of the power supply architecture 200.

Due to the use of the inverter stage 402 as a type of comparator, the inverter stage 402 is susceptible to inaccurate determinations of the state of VDD. Previous implementations of a supply detector utilize a bandgap reference, which may be highly accurate but can be complicated and can consume large amounts of power and circuit area. The accuracy provided by a bandgap reference supply detector is not necessary, because the simpler supply detector 312 shown in FIG. 4 may provide the same function as described below.

In an illustrative example of an uncertain VDD supply, VDD is ramping up from 0V to 1.1V as VDDALDO is at 1.8V. While VDD is less than 0.3V, the input signal is low, the output signal is low, and the level-shifter circuit 300 has reduced leakage as described in the above example. As VDD increases above 0.3V, the output should remain at a predictable value (e.g., logic low) because VDD is not at a valid voltage level, but it is no longer guaranteed that PWGDD is low and PWGDDZ is high. At some time after VDD has increased above 0.3V, but before VDD has reached the minimum valid value of 0.7V, the supply detector 312 determines that VDD is valid. As a result, PWGDD goes to logic high and PWGDDZ goes to logic low, which turns off the transistors Mpd1-Mpd6, and turns on the transistors ML1 and ML2.

Because the Input signal remains at logic low, M1 is off and cuts off the drain of M3 from 0V. InputZ may be sufficiently high to turn on M2, but not necessarily. If M2 is turned on, the gate of M3 is pulled substantially to 0V, and the drain of M3 remains high. If M2 is not turned on, the charge level on the gate of M3 remains from being previously pulled down by Mpd3, and the drain of M3 remains high. Thus, the output terminal is at logic low regardless of incorrectly determining VDD due to pulling the gate of M3 to 0V while VDD is detected as invalid. If Mpd3 was configured to pull the gate of M3 to VDDALDO, the output signal could be unpredictable if the supply detector 312 enables the level-shifter 306 (i.e., via PWGDD and PWGDDZ) too early.

Figure 5:
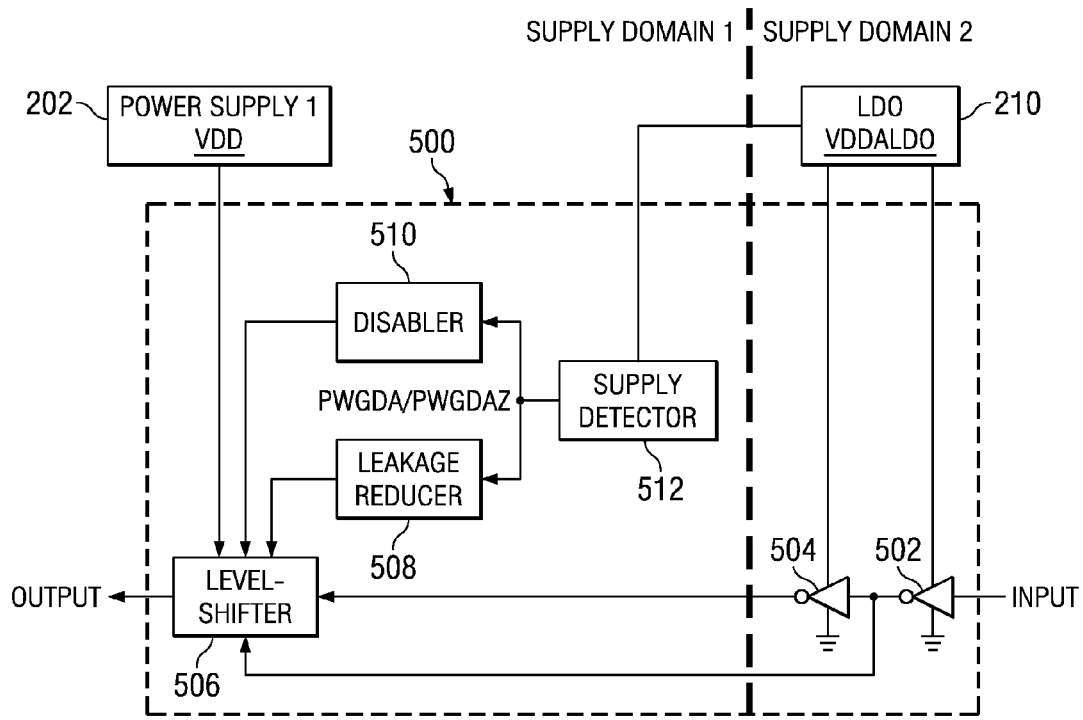
FIG. 5 is an example implementation of another one of the level-shifter circuits of FIG. 2 including leakage protection, to shift signals from a second supply domain to a first supply domain.

FIG. 5 is an example implementation of another one of the level-shifter circuits of FIG. 2, to shift signals from the second supply domain to the first supply domain, including leakage protection. Specifically, FIG. 5 is a block diagram of a level-shifter circuit 500 that may be used to implement the level-shifter 218 of FIG. 2. In a similar manner to the level-shifter circuit 300, the level-shifter circuit 500 receives a digital input signal in one supply domain and shifts a voltage level of the input signal to generate a digital output signal consistent with another supply domain. In this example, however, the input signal originates in supply domain 2 using the LDO 210 as a voltage supply at VDDALDO. The digital signal is shifted to supply domain 1, which uses the power supply 1 202 at VDD.

The example level-shifter circuit 500 includes the same basic functions as the example level-shifter circuit 300 of FIG. 3, including a first logical NOT gate 502 and a second logical NOT gate 504, a level-shifter 506, a leakage reducer 508, a disabler 510, and a supply detector 512. Moreover, the NOT gates 502 and 504, the level-shifter 506, the leakage reducer 508, the disabler 510, and the supply detector 512 perform substantially the same functions as the counterpart components 302-312 of the level-shifter circuit 300 of FIG. 3. The level-shifter circuit 500 allows a user or designer to disconnect or turn off power to the LDO 210 without causing substantial current leakage in supply domain 1.

Figure 6:
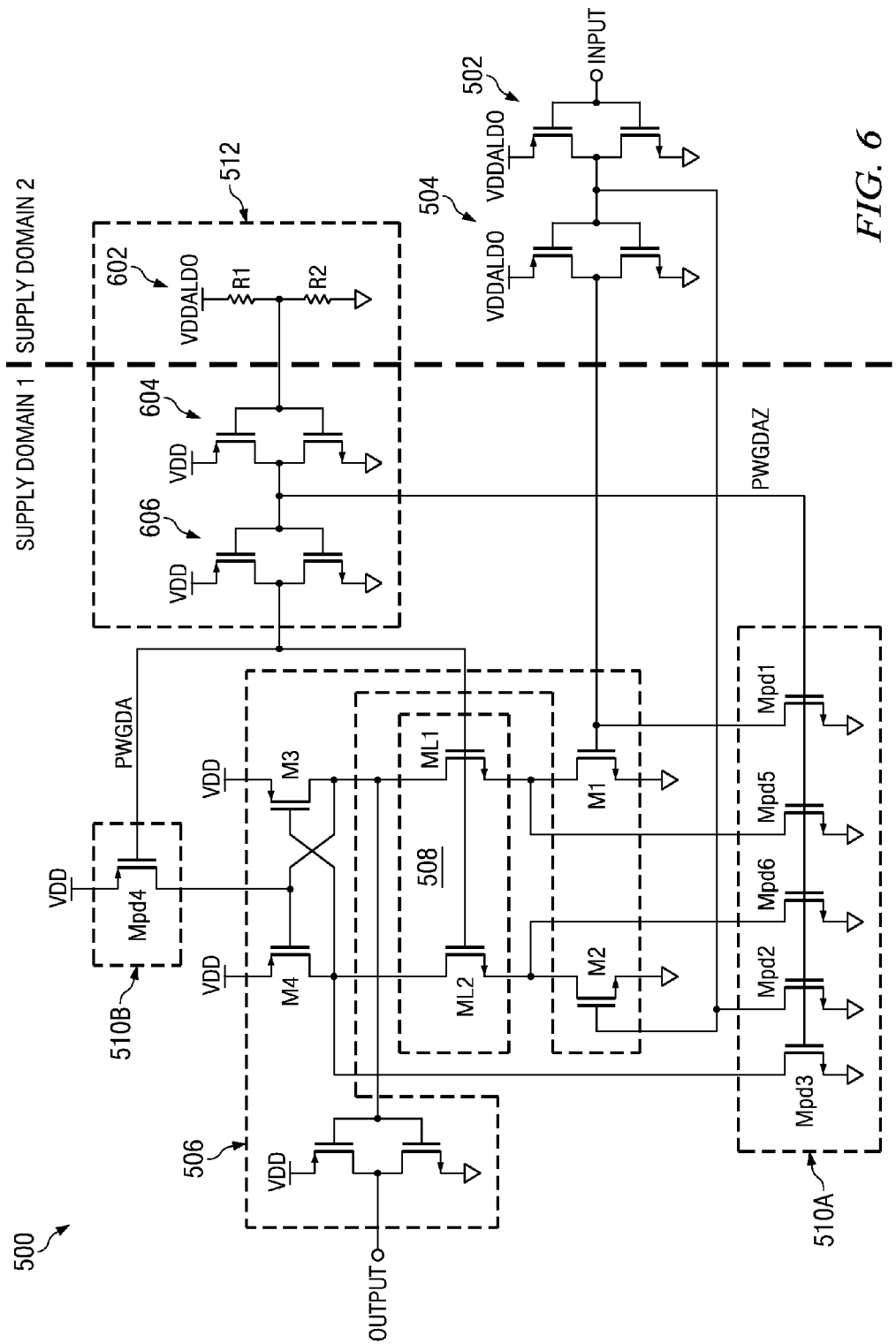
FIG. 6 is a detailed schematic diagram of a level-shifter circuit to implement the example level-shifter circuit of FIG. 5.

FIG. 6 is a detailed schematic diagram of a level-shifter circuit to implement the example level-shifter circuit 500 of FIG. 5. As mentioned above, the level-shifter circuit 500 performs substantially the same functions as the level-shifter circuit 300. However, due to the voltage VDDALDO being larger than the voltage VDD, the example supply detector 512 is implemented differently than the supply detector 312. The supply detector 512 includes a voltage divider 602 made up of resistors R1 and R2, a first logical NOT gate 604 and a second logical NOT gate 606. The voltage divider 602 is in supply domain 2, and may be configured so that the input to the first NOT gate 604 is approximately equal or slightly greater than the maximum expected VDD when VDDALDO is at maximum. The NOT gates 604 and 606 are in supply domain 1. Thus, when VDDALDO is valid, the NOT gate 604 generates PWGDAZ to be logic low, and the NOT gate 606 generates PWGDA to be logic high, such that both PWGDA and PWGDAZ are consistent with logic levels for VDD. As a result, the level-shifter circuit 500 operates normally as described above in connection with the level-shifter circuit 300.

In contrast, when VDDALDO is invalid, the voltage divider 602 is pulled to logic low by the resistor R2. The logic low input to the NOT gate 604 generates a PWGDAZ at logic high, which causes the NOT gate 606 to generate a PWGDA at logic low. The leakage reducer 508 and the disabler 510 disable the level-shifter 506 in response to the PWGDA and PWGDAZ signals, reducing current leakage and producing a predictable output signal in a similar manner to the leakage reducer 308 and the disabler 310 described above.

It should be noted that the voltage divider 602 may introduce an additional load during normal operation when VDDALDO is valid. To reduce the power consumption caused by the voltage divider 602, R1 and R2 may be implemented using large resistance values. Large resistance values will cause the load to be very small, and can be considered negligible when compared to the active load currents of the analog modules 208 and 212 of FIG. 2.

Figure 7:
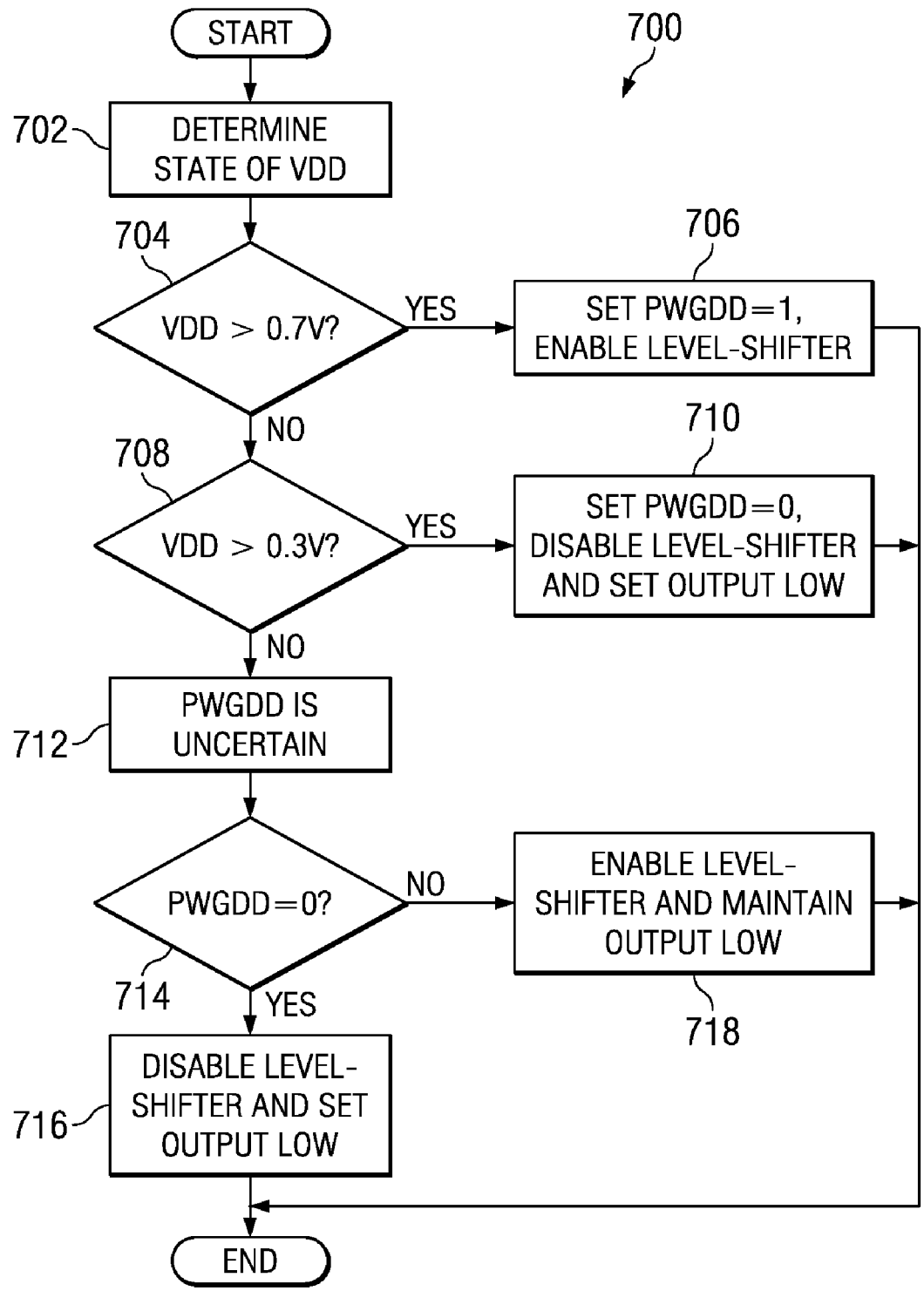
FIG. 7 is a flowchart illustrating an example process to provide leakage protection in a level-shifter circuit.

FIG. 7 is a flowchart illustrating an example process 700 to provide leakage protection in a level-shifter circuit. The process 700 may be used to implement the example level-shifter circuit 300 of FIGS. 3 and 4. However, it should be recognized that the process 700 may be easily adapted to implement the level-shifter circuit 500 of FIGS. 5 and 6. First, the process 700 (e.g., via the supply detector 312) determines the state of VDD (block 702). VDD may be sufficiently on (e.g., VDD>0.7V), sufficiently off (VDD<0.3V), or in an uncertain range (e.g., 0.3V<VDD<0.7V). If VDD is greater than 0.7V (block 704), the supply detector 312 sets one or more detection signals (e.g., PWGDD and/or PWGDDZ) to indicate that VDD is valid, which enables a level-shifter (e.g., the level-shifter 306) via a leakage reducer and a disabler (e.g., the leakage reducer 308 and the disabler 310, respectively). For example, the supply detector sets PWGDD to logic high (block 706).

If the supply detector 312 determines that VDD is not greater than 0.7V, the supply detector 312 determines whether VDD is less than 0.3V (block 708). If VDD is less than 0.3V, the supply detector 312 sets the detection signal PWGDD to logic low, which disables the level-shifter 306 and causes the output signal from the level-shifter circuit 300 to be set to logic low (block 710). If the process 700 determines that VDD is valid or invalid and responds at block 706 or block 710, respectively, the process 700 may end. Alternatively, the example process 700 may iterate to monitor the state of VDD.

If the supply detector 312 cannot determine that VDD is valid (block 706) or invalid (block 710), PWGDD is considered to be uncertain, as the example supply detector 312 may set PWGDD to either logic low or logic high (block 712). The leakage reducer 308 and the disabler 310 respond to the PWGDD signal set by the supply detector 312 and, thus, monitor PWGDD. If PWGDD is set to logic low (block 714), the leakage reducer 308 and the disabler 310 disables the level-shifter to reduce leakage, and sets the output of the level-shifter circuit 300 to logic low (block 716). In contrast, if PWGDD is not at logic low (i.e., PWGDD is at logic high), the leakage reducer 308 and the disabler 310 enable the level-shifter 306 and maintain the output at logic low (block 718). Block 718 is performed due because the digital input signal remains at a logic low level, as VDD is not valid despite the indication of PWGDD. After either block 716 or block 718, the process 700 may end. Alternatively, the example process 700 may iterate to monitor the state of VDD.

Although certain methods, apparatus, and articles of manufacture have been described herein, other implementations are possible. The scope of coverage of this patent is not limited to the specific examples described herein. On the contrary, this patent covers all apparatus, methods and articles of manufacture fairly falling within the scope of the invention.

What is claimed is:

1. A low-leakage, level-shifter circuit comprising:
a first power supply providing a first voltage relative to a ground potential;
a second power supply providing a second voltage relative to the ground potential;
level-shifter circuitry having an input receiving logic state signals based on the first supply voltage and having an output supplying corresponding logic state signals based on the second supply voltage, the level-shifter circuitry including a first transistor and a second transistor coupled between the second voltage and ground and coupled between the input and the output;
a supply detector coupled to the first power supply to provide a detection signal based on the first voltage;
a leakage reducer, coupled between the first and second transistors and the output and, based on the detection signal, setting the logic state of the output to a predetermined state; and
a disabler, coupled between the first and second transistors and the ground potential and, based on the detection signal, pulling all terminals of the first and second transistors to the ground potential.

2. A level-shifter circuit as defined in claim 1, wherein the supply detector is configured to generate the detection signal when the first voltage is greater than a predetermined threshold voltage.

3. A level-shifter circuit as defined in claim 1, wherein the first and second transistors shift a voltage level of an input logic state to a voltage level of an output logic state in response to the detection signal.

4. A level-shifter circuit as defined in claim 1, wherein the first voltage is less than the second voltage, and the supply detector comprises a first logical inverter and a second logical inverter, an input to the first inverter is the first voltage, and a supply voltage to the first and second logical inverters is the second voltage.

5. A level-shifter circuit as defined in claim 1, wherein the first voltage is greater than the second voltage, and the supply detector comprises a voltage divider configured to generate an input voltage based on the first supply voltage, a first logical inverter, and a second logical inverter, and a supply voltage to the first and second logical inverters is the second voltage.

6. A level-shifter circuit as defined in claim 5 in which at power-on of the first power supply the first voltage rises from ground potential to a maximum potential, and wherein the supply detector is configured such that the input voltage generated by the voltage divider is greater than the second voltage when the first voltage is substantially at maximum.

7. A level-shifter circuit as defined in claim 1, wherein the leakage reducer comprises a first decoupling transistor and a second decoupling transistor that are coupled to and smaller than the first and second transistors of the level-shifter.

8. A level-shifter circuit as defined in claim 1, wherein the disabler is configured to set the logic state of the output of the level-shifter to a predetermined state when the first voltage is less than a predetermined threshold.

9. A level-shifter circuit as defined in claim 1, wherein the disabler is configured to maintain a logic state of the output until the detection signal indicates the first voltage has increased above a predetermined threshold.

10. A method to reduce leakage in a level-shifter circuit, comprising:
generating a detection signal based on a first voltage provided from a first power supply relative to circuit ground in a first power supply domain, wherein the detection signal is a digital signal having a voltage based on a second voltage from a second power supply relative to the circuit ground in a second power supply domain;
setting an output of the level-shifter circuit to a predetermined digital signal in the second power supply domain based on the detection signal; and
pulling all of the terminals of a first transistor and a second transistor coupled to the output of the level-shifter circuit to circuit ground based on the detection signal.

11. A method as defined in claim 10, further comprising maintaining the output at the predetermined digital signal in response to the detection signal changing a state.

12. A method as defined in claim 10, wherein the detection signal indicates a valid input signal when the detection signal is greater than a first predetermined threshold voltage and the detection signal indicates an invalid input signal when the detection signal is less than a second predetermined threshold voltage that is less than the first predetermined threshold voltage.

13. A method as defined in claim 10, wherein the detection signal is indicative of an invalid input signal when the first supply voltage is less than a predetermined voltage threshold and the detection signal is indicative of a valid input signal when the first supply voltage is greater than the predetermined voltage threshold.

14. A method as defined in claim 10, further comprising setting the output signal of the level-shifter to a logical value equal to an input signal of the level-shifter in response to the detection signal.

15. A method as defined in claim 10, further comprising selectively disabling the level-shifter in response to the detection signal being indicative of an invalid input signal.

16. A method as defined in claim 10, further comprising selectively disabling the level-shifter and generating the output signal in response to disabling the first supply voltage.

17. A level-shifter circuit having reduced leakage, comprising:
  a first power supply providing a first voltage relative to a ground potential;
  a second power supply providing a second voltage relative to the ground potential;
  a supply detector to generate a detection signal based on whether the first voltage is greater than a predetermined threshold voltage;
  a level-shifter having an input receiving a digital signal input, the level-shifter comprising a first n-type transistor coupled to a first p-type transistor, and a second p-type transistor coupled to a second n-type transistor, wherein the first n-type transistor is configured to selectively couple an output terminal to the ground potential based on the digital input signal, the second n-type transistor is configured to selectively couple a gate terminal of the first p-type transistor to the ground potential based on the digital input signal, and the first p-type transistor is configured to selectively couple the output terminal to the second voltage;
  a plurality of power-down transistors to selectively pull gate terminals and drain terminals of the first and second n-type transistors to the ground potential, based on the detection signal; and
  a first decoupling transistor and a second decoupling transistor configured to reduce leakage current flowing through the first and second n-type transistors and the first and second p-type transistors based on the detection signal.

* * * * *